(12) United States Patent  (10) Patent No.: US 8,058,733 B2
Yang  (45) Date of Patent: Nov. 15, 2011

(54) SELF-ALIGNED CONTACT SET

(75) Inventor: Chan-Lon Yang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/825,515

(22) Filed: Jun. 29, 2010

(65) Prior Publication Data

US 2010/0264550 A1    Oct. 21, 2010

Related U.S. Application Data

(62) Division of application No. 11/681,993, filed on Mar. 5, 2007, now Pat. No. 7,772,064.

(51) Int. Cl.
*H01L 23/48* (2006.01)
*H01L 23/52* (2006.01)
*H01L 29/40* (2006.01)

(52) U.S. Cl. .......... 257/774; 257/775; 257/E21.44; 257/E21.507; 438/640

(58) Field of Classification Search .......... 438/952, 438/640; 257/E21.44
See application file for complete search history.

(56) References Cited

U.S. PATENT DOCUMENTS

| | | | |
|---|---|---|---|
| 5,856,067 A | 1/1999 | Gabbrielli et al. | |
| 6,121,098 A | 9/2000 | Strobl | |
| 6,121,129 A * | 9/2000 | Greco et al. | 438/622 |
| 6,165,880 A | 12/2000 | Yaung et al. | |
| 6,214,656 B1 | 4/2001 | Liaw | |
| 6,451,651 B1 * | 9/2002 | Park et al. | 438/253 |
| 6,521,540 B1 | 2/2003 | Li | |
| 6,559,044 B1 | 5/2003 | Chen et al. | |
| 6,562,714 B1 | 5/2003 | Lee | |
| 7,037,762 B2 | 5/2006 | Joo et al. | |
| 7,037,774 B1 | 5/2006 | Syau | |
| 2002/0048880 A1 | 4/2002 | Lee | |
| 2004/0084746 A1 | 5/2004 | Kim et al. | |
| 2005/0136649 A1 | 6/2005 | Lee et al. | |
| 2006/0091490 A1 | 5/2006 | Chen et al. | |
| 2006/0115983 A1 * | 6/2006 | Fujii et al. | 438/640 |
| 2006/0170106 A1 | 8/2006 | Tseng et al. | |
| 2006/0189080 A1 | 8/2006 | Lee et al. | |
| 2007/0004193 A1 | 1/2007 | Wu et al. | |

FOREIGN PATENT DOCUMENTS

TW    1275130 B    3/2007

* cited by examiner

*Primary Examiner* — Ha Tran T Nguyen
*Assistant Examiner* — Shaka Scarlett
(74) *Attorney, Agent, or Firm* — Chun-Ming Shih (57) ABSTRACT

A self-aligned contact includes a lower contact disposed in a dielectric layer of a substrate and an upper contact disposed in the dielectric layer and directly on the lower contact, and electrically connected to the lower contact. The profile of the upper contact and the lower contact is zigzag.

9 Claims, 6 Drawing Sheets

SELF-ALIGNED CONTACT SET

CROSS-REFERENCE TO RELATED APPLICATIONS

This application is a divisional application of U.S. patent application Ser. No. 11/681,993, filed on Mar. 5, 2007 now U.S. Pat. No. 7,772,064.

BACKGROUND

1. Field of Invention

The present invention relates to an integrated circuit device and a method of fabricating the same, and more particularly to a self-aligned contact and a method of fabricating the same.

2. Description of Related Art

Along with the development of science and technology, the integration of electronic devices must be improved to meet the trend of light, thin, short, and small electronic devices. In addition to reducing the size of the semiconductor devices, the method of improving the integration can also be achieved by reducing the distance between semiconductor devices. However, some process problems are unavoidable no matter the size of the semiconductor devices or the distance between the semiconductor devices is reduced.

As for a contact process, after the contact is downsized, the aspect ratio of the contact is increased, such that the etching becomes difficult and the process window becomes small. In order to remove the residual in the etching process and keep contact opening open through to the contact region, generally, a long time over-etching is performed to avoid that the contact opening cannot be fully opened through to the contact region. However, during a lithography process, misalignment often occurs, and the contact opening always forms a tilted angle with respect to the vertical surface of the substrate. If the over-etching takes a long time, a top corner of a gate may be exposed easily, resulting in that the metal layer filled in the contact opening is electrically connected to the gate and a source/drain region and causing short circuit.

BRIEF SUMMARY

The present invention is directed to providing a self-aligned contact process, so as to avoid the short circuit between the gate and the source/drain region.

The present invention is directed to providing a self-aligned contact process to reduce the difficulty in etching, increase the process window, and improve the throughput.

The present invention provides a method of fabricating a self-aligned contact. A first dielectric layer is formed on a substrate having a contact region thereon. Next, a lower opening corresponding to the contact region is formed in the first dielectric layer. Thereafter, a second dielectric layer is formed on the first dielectric layer, and then an upper opening self-aligned to and communicated with the lower opening is formed in the second dielectric layer, wherein the upper opening and the lower opening constitute a self-aligned contact opening. Afterwards, the self-aligned contact opening is filled with a conductive layer.

In the method of fabricating a self-aligned contact according to an embodiment of the present invention, in the step of forming the lower opening in the first dielectric layer, the formed lower opening exposes a portion of the second dielectric layer on the contact region, and after the step of forming the upper opening, the lower opening further exposes the contact region.

In the method of fabricating a self-aligned contact according to an embodiment of the present invention, the material of the first dielectric layer is different from the material of the second dielectric layer.

In the method of fabricating a self-aligned contact according to an embodiment of the present invention, the first dielectric layer comprises a stress layer. The material of the stress layer comprises silicon nitride.

In the method of fabricating a self-aligned contact according to an embodiment of the present invention, the size of the lower opening is different form the size of the upper opening.

In the method of fabricating a self-aligned contact according to an embodiment of the present invention, the size of the lower opening is smaller than the size of the upper opening.

In the method of fabricating a self-aligned contact according to an embodiment of the present invention, in the step of forming the lower opening in the first dielectric layer and the step of forming the upper opening in the second dielectric layer, two different masks are adopted to perform each exposure process.

In the method of fabricating a self-aligned contact according to an embodiment of the present invention, in the step of forming the lower opening in the first dielectric layer and the step of forming the upper opening in the second dielectric layer, the same mask is used to perform each exposure process, and a process parameter is adjusted to expose two patterns of different sizes. The process parameter comprises exposure energy.

In the method of fabricating a self-aligned contact according to an embodiment of the present invention, the method of forming the lower opening comprises forming a bottom anti-reflective coating (BARC) on the first dielectric layer. Then, a patterned photoresist layer is formed on the BARC. The first dielectric layer is etched with the patterned photoresist layer as a mask, so as to form the lower opening. Afterwards, the patterned photoresist layer is removed and the BARC is selectively removed.

In the method of fabricating a self-aligned contact according to an embodiment of the present invention, if the material of the BARC is an organic material, the BARC is removed when removing the patterned photoresist layer.

In the method of fabricating a self-aligned contact according to an embodiment of the present invention, if the material of the BARC is an inorganic material, the BARC is not removed when or after removing the patterned photoresist layer.

In the method of fabricating a self-aligned contact according to an embodiment of the present invention, wherein the material of the second dielectric layer is selected from a group consisting of silicon oxide deposited by atmospheric pressure chemical vapor deposition (CVD), silicon oxide deposited by high density plasma vapor deposition, phosphosilicate glass, borophosphosilicate glass, fluorine-doped silicon glass (FSG), and a combination thereof.

In the method of fabricating a self-aligned contact according to an embodiment of the present invention, the method of forming the upper opening comprises forming a BARC on the second dielectric layer. Then, a patterned photoresist layer is formed on the BARC. Then second dielectric layer is etched with the patterned photoresist layer as a mask, so as to form the upper opening. Afterwards, the patterned photoresist layer is removed and the BARC is selectively removed. In the method of fabricating a self-aligned contact according to an embodiment of the present invention, if the material of the BARC is an organic material, the BARC is removed when or after removing the patterned photoresist layer.

In the method of fabricating a self-aligned contact according to an embodiment of the present invention, if the material of the BARC is an inorganic material, the BARC is not removed when or after removing the patterned photoresist layer.

In the method of fabricating a self-aligned contact according to an embodiment of the present invention, the contact region is a source/drain region.

In the method of fabricating a self-aligned contact according to an embodiment of the present invention, the material of the source/drain region mainly comprises semiconductor compound.

In the method of fabricating a self-aligned contact according to an embodiment of the present invention, the semiconductor compound is SiGe or SiC.

In the method of fabricating a self-aligned contact according to an embodiment of the present invention, a metal silicide layer is overlaid on the source/drain region.

The present invention provides a self-aligned contact, which comprises a lower contact disposed in a dielectric layer of a substrate and an upper contact disposed in the dielectric layer and directly on the lower contact, and electrically connected to the lower contact, wherein the profile of the upper contact and the lower contact is zigzag.

In the self-aligned contact according to an embodiment of the present invention, the lower contact has a wide top end and a narrow bottom end.

In the self-aligned contact according to an embodiment of the present invention, the upper contact has a wide top end and a narrow bottom end.

In the self-aligned contact according to an embodiment of the present invention, the size of the top end of the upper contact is larger than the size of the top end of the lower contact.

In the self-aligned contact according to an embodiment of the present invention, the dielectric layer comprises a first dielectric layer and a second dielectric layer, the lower contact is disposed in the first dielectric layer, and the upper contact is disposed in the second dielectric layer.

In the self-aligned contact according to an embodiment of the present invention, the first dielectric layer is a stress layer.

In the self-aligned contact according to an embodiment of the present invention, wherein the material of the first dielectric layer is selected from a group consisting of silicon oxide deposited by atmospheric pressure CVD, silicon oxide deposited by high density plasma vapor deposition, phosphosilicate glass, borophosphosilicate glass, fluorine-doped silicon glass and combinations thereof.

The self-aligned contact process of the present invention can avoid the short circuit between the gate and the source/drain region.

Moreover, staged etching can reduce the difficulty in etching and avoid that the contact opening cannot be fully opened through to the contact region. Therefore, the present invention may improve the process window and improve the throughput.

In the other aspect, the widely used stress layer can be used in the present invention, so the process window can be improved without adding too many steps.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The First Embodiment

FIGS. 1A-1E are sectional views of processes of the method of fabricating a semiconductor device according to an embodiment of the present invention.

Figure 1A:
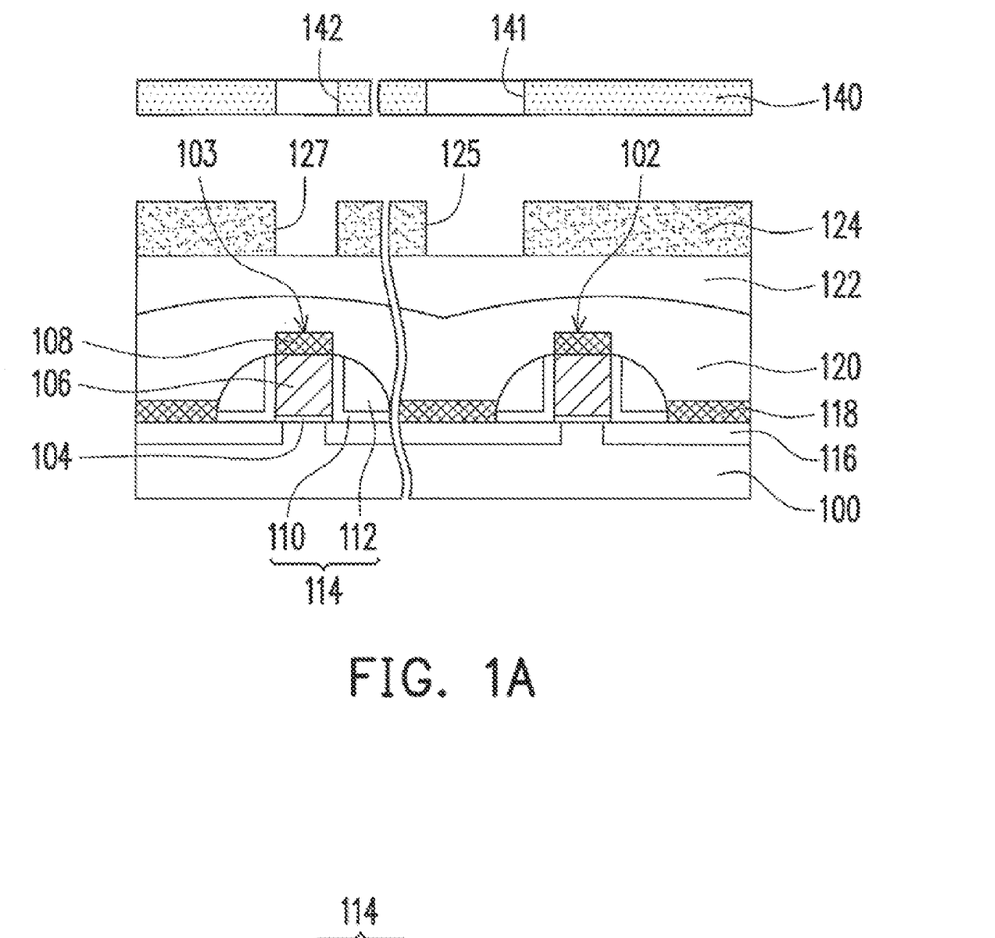
FIGS. 1A-1F are sectional views of processes of the method of fabricating a semiconductor device according to an embodiment of the present invention.

Referring to FIG. 1A, a substrate 100 is provided first. The substrate 100 is, for example, a silicon substrate, such as an N-type silicon substrate or a P-type silicon substrate. Definitely, the substrate 100 can also be a silicon-on-insulator (SOI) substrate. Transistors 102 and 103 which are for example, N-channel metal-oxide-semiconductors (NMOS) or P-channel metal-oxide-semiconductors (PMOS) are formed on the substrate 100.

The transistors 102 and 103 respectively include a gate dielectric layer 104, a gate 106, a spacer 114, and a source/drain 116. The gate dielectric layer 104 is disposed between the gate 106 and the substrate 100. The material of the gate dielectric layer 104 is composed of silicon oxide layer. The material of the gate 106 includes a silicon-based-material, for example, one selected from among doped silicon, undoped silicon, doped polysilicon, or undoped polysilicon. If the material of the gate 106 is doped silicon or doped polysilicon, the dopant in the silicon or polysilicon is an N-type dopant, or a P-type dopant. The spacer 114 includes a spacer 110 and a spacer 112. The materials of the spacer 110 and the spacer 112 are the same or different, for example, silicon oxide or silicon nitride. In an embodiment, the materials of the spacer 110 and the spacer 112 are silicon oxide and silicon nitride respectively. Moreover, the spacer 114 can also include a single spacer, and the shape thereof is not particularly limited.

The source/drain 116 is disposed in the substrate at both sides of the gate 106. The material of the source/drain 116 is, for example, semiconductor material or the material mainly containing semiconductor compound. The semiconductor material is, for example, silicon. The material of semiconductor compound is, for example, SiGe or SiC.

In an embodiment, metal silicide layers 108 and 118 are respectively disposed on the surface of the gate 106 and on the source/drain region 116. The metal silicide layers 108 and 118 include metal silicide layers of refractory metal, for example, one selected from among the silicides of Ni, Co, Ti, Cu, Mo, Ta, W, Er, Zr, Pt, and an alloy thereof.

Still referring to FIG. 1A, a dielectric layer 120 is formed on the substrate 100. In an embodiment, the dielectric layer 120 is, for example, a stress layer. The stress layer is a material layer commonly used in semiconductor process for increasing mobility of electrons or holes in channels of MOS transistor, and is generally formed on the substrate 100 after fabricating the MOS transistor. As for a PMOS transistor, a stress layer having compressive stress formed on the substrate generates a compressive stress along the channel direction in the PMOS transistor. As for an NMOS transistor, a stress layer having tensile stress formed on the substrate generates a tensile stress along the channel direction in the NMOS transistor. Along with the increase of the compressive stress or the tensile stress, the mobility of electrons or holes in the channel increases, thereby increasing the drive current to improve device performance. The material of the stress layer is, for example, silicon nitride, and the method of forming the same is, for example, chemical vapor deposition. In other embodiments, the material of the dielectric layer 120 is, for example, silicon oxide.

Referring to FIG. 1A, a bottom anti-reflective coating (BARC) 122 is formed on the dielectric layer 120, so as to reduce the step height of the surface of wafer, inhibit standing wave effect, and improve lithography quality. The material of the BARC 122 is an organic material or an inorganic material. The organic material is, for example, polyimide or polysulfone. The inorganic material is, for example, $SiO_xN_y$, and the forming method is plasma enhanced chemical vapor deposition with silane, nitrogen gas, and nitrous oxide as reactive gas. Then, a patterned photoresist layer 124 is formed on the BARC 122. The method of forming the patterned photoresist layer 124 includes forming a photoresist material layer (not shown) on the BARC 122, transferring the patterns 142 and 141 on the mask 140 to the photoresist material layer through an exposure process, and development process, so as to form-ing the patterned photoresist layer 124.

Figure 1B:
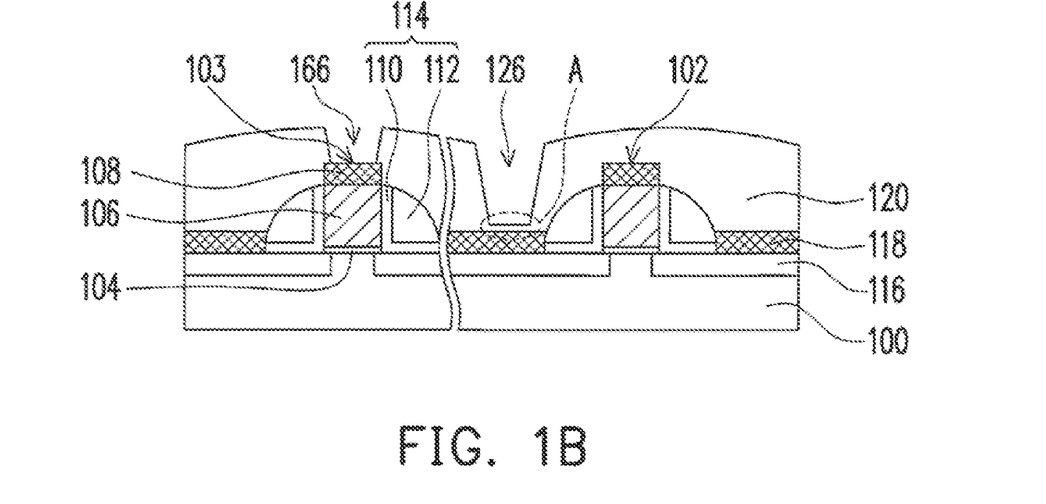

Referring to FIG. 1B, the dielectric layer 120 is etched with the patterned photoresist layer 124 as an etching mask, so as to form a lower opening 126 corresponding to the source/drain region 116 and a lower opening 166 corresponding to the gate 106 of the transistor 103 in the dielectric layer 120. In an embodiment, the lower opening 126 does not expose the source/drain region 116, and a portion of the dielectric layer 120 is overlaid on the source/drain region 116, as shown in Region A, so as to protect the source/drain region 116 from being damaged by etching during the subsequent etching process. The lower opening 166 exposes the metal silicide layer 108 on the gate 106 of the transistor 103. The method of etching the dielectric layer 120 is an anisotropic etching process, for example, dry etching process with fluorocarbon or various known gases as an etching gas source. Then, the patterned photoresist layer 124 is removed. The method of removing the patterned photoresist layer 124 is, for example, wet removing, or dry removing such as oxygen plasma ashing. If the material of the BARC 122 is an organic material, the BARC 122 is removed when or after removing the patterned photoresist layer 124. If the material of the BARC 122 is an inorganic material, the BARC 122 needs not to be removed when or after removing or after removing the patterned photoresist layer 124.

Figure 1C:
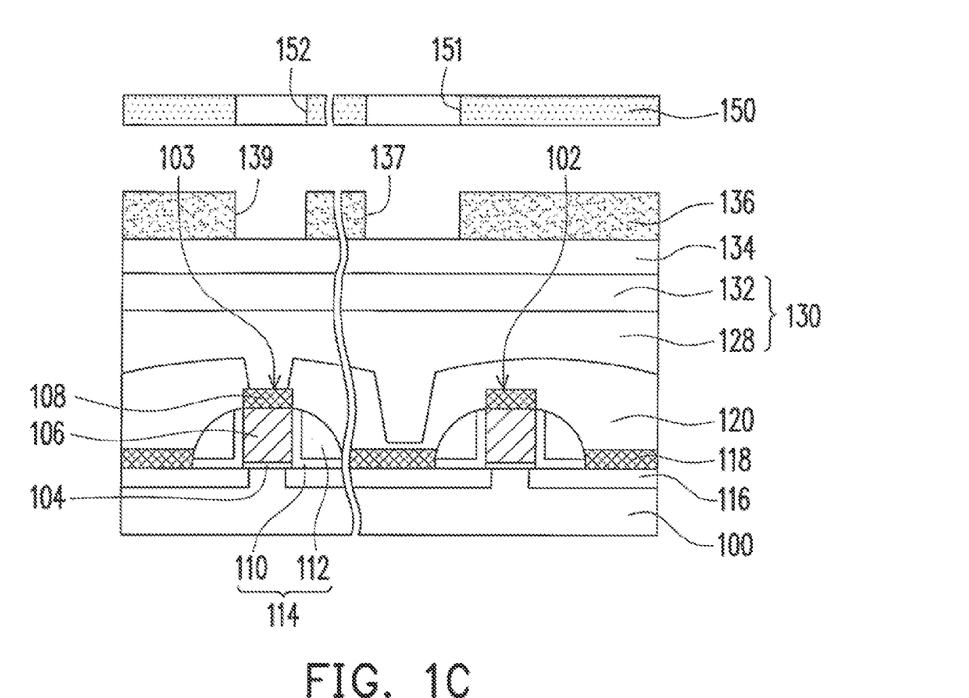

Referring to FIG. 1C, another dielectric layer 130 is formed on the substrate 100. The dielectric layer 130 includes, for example, a single layer, or more than two material layers. In this embodiment, the dielectric layer 130 including two dielectric layers 128 and 132 is taken as an example for illustration. The material of the dielectric layers 128 and 132 is, for example, silicon oxide deposited by atmospheric pressure CVD, silicon oxide deposited by high density plasma vapor deposition, phosphosilicate glass, borophosphosilicate glass, or fluorine-doped silicon glass. In an embodiment, the dielectric layer 128 is, for example, a silicon oxide layer deposited by atmospheric pressure CVD, and the dielectric layer 132 is, for example, a phosphosilicate glass layer. The BARC 134 is formed on the dielectric layer 130. The material of the BARC 134 is, for example, organic material or inorganic material. The organic material is, for example, polyimide or polysulfone. The inorganic material is, for example, $SiO_xN_y$, and the forming method is plasma enhanced chemical vapor deposition with silane, nitrogen gas, and nitrous oxide as reactive gas. Then, a patterned photoresist layer 136 is formed on the BARC 134. The method of forming the patterned photoresist layer 136 includes forming a photoresist material layer (not shown) on the BARC 134, transferring the patterns 152 and 151 on the other mask 150 to the photoresist material layer through an exposure process, and development process, so as to form the patterned photoresist layer 136. In this embodiment, the patterns 151 and 152 of the mask 150 are different from the patterns 141 and 142 of the mask 140. If the size of the openings 137 and 139 to be formed in the patterned photoresist layer 136 is larger than the size of the openings 125 and 127 to be formed in the patterned photoresist layer 124 (FIG. 1A), the size of the patterns 151 and 152 of the mask 150 is larger than the size of the patterns 141 and 142 of the mask 140 (FIG. 1A).

Figure 1D:
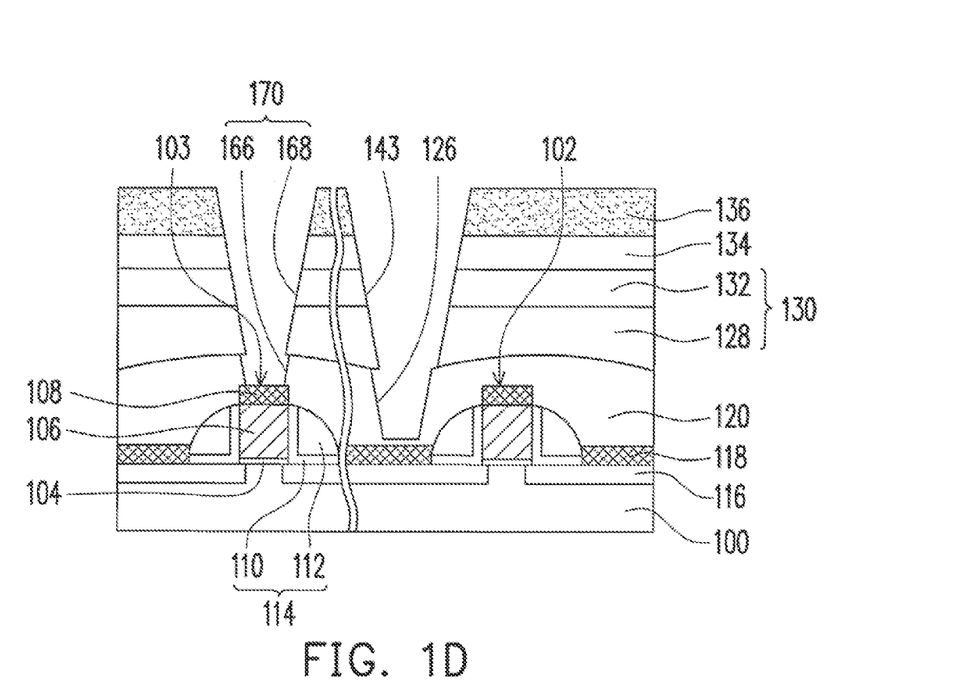

Referring to FIG. 1D, the dielectric layer 130 is etched with the patterned photoresist layer 136 as an etching mask, so as to form upper openings 143 and 168, in the dielectric layer 130. The upper opening 143 is self-aligned to and communicated with the lower opening 126. The upper opening 168 is self-aligned to and communicated with the lower opening 166, so as to constitute a self-aligned contact opening 170 together. When the material of the dielectric layer 120 is different from the material of the dielectric layer 130, for example, the dielectric layer 120 is a stress layer and the dielectric layer 130 is silicon oxide, the dielectric layer 120 is used as an etch stop layer. The method of etching the dielectric layer 130 is an anisotropic etching process, for example, dry etching process with fluorocarbon or various known gases as the etching gas source.

Figure 1E:
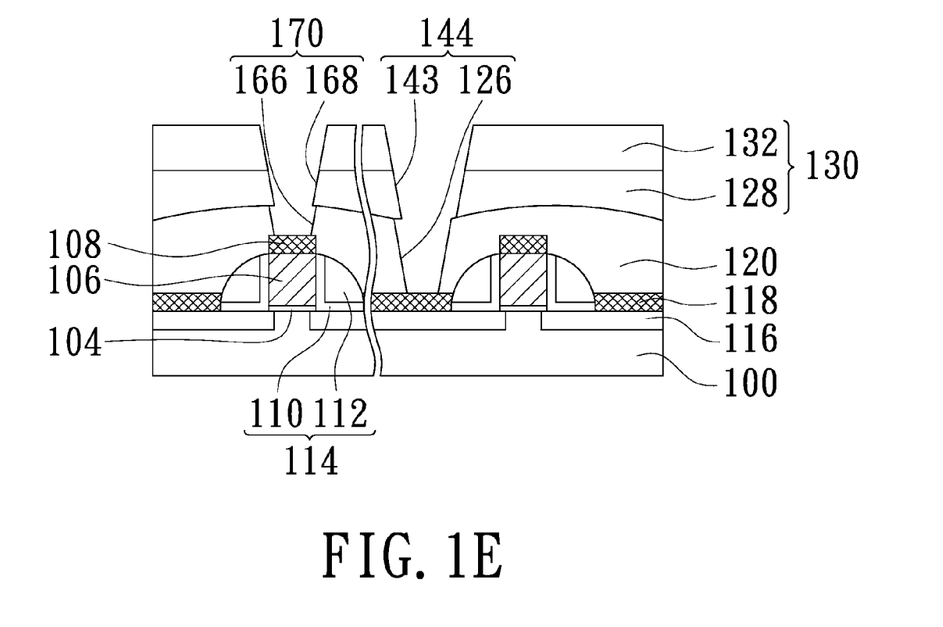

Referring to FIG. 1E, the dielectric layer 120 at the bottom of the lower opening 126 is removed, so as to expose the metal silicide layer 118 on the source/drain region 116, thus completing the self-aligned contact opening 144 constituted by the upper opening 143 and the lower opening 126. The method of removing the dielectric layer 120 at the bottom of the lower opening 126 is the anisotropic etching process, for example, dry etching process with fluorocarbon or various known gases as the etching gas source. Then, the patterned photoresist layer 136 is removed. The method of removing the patterned photoresist layer 136 is for example, wet removing, or dry removing such as oxygen plasma ashing. If the material of the BARC 134 is an organic material, the BARC 134 is removed when or after removing the patterned photoresist layer 136. If the material of the BARC 134 is an inorganic material, the BARC 134 needs not to be removed.

Figure 1F:
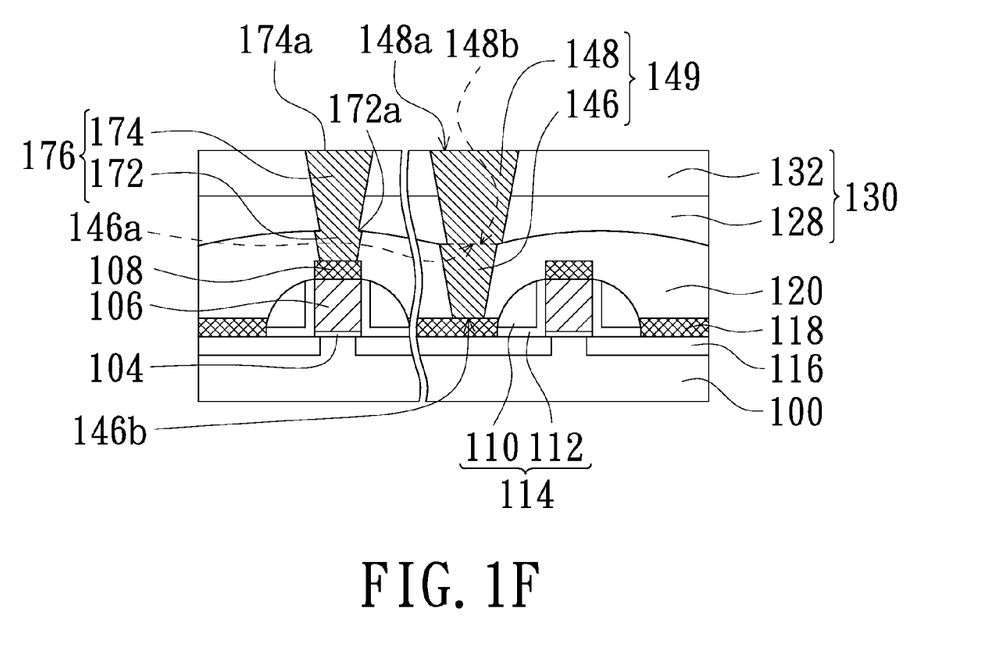

Referring to FIG. 1F, the self-aligned contact openings 144 and 170 are filled with a conductive layer, so as to form self-aligned contacts 149 and 176. The method of forming the conductive layer includes successively forming conductive material layers covering the dielectric layer 130 and filling the self-aligned contact openings 144 and 170 on the substrate 100, and removing the portion of conductive material layer covering the dielectric layer 130 with chemical mechanical polishing or an etch back technique, thus finishing the fabrication of the self-aligned contacts 149 and 176. The material of the conductive material layer is, for example, W, Cu, or an alloy thereof, or doped polysilicon. Usually, in addition to the above-mentioned materials, the conductive material layer further includes a barrier layer or an adhesive layer, which is made of, for example, titanium, tantalum, titanium nitride, tantalum nitride, or a combination thereof.

The self-aligned contact 149 according to the embodiment of the present invention is constituted of a lower contact 146 and an upper contact 148. The profile of the upper contact 148 and the lower contact 146 is zigzag. In an embodiment, both the lower contact 146 and the upper contact 148 have wider top ends 146a, 148a and narrow bottom ends 146b, 148b. In another embodiment, the size of the top end 148a of the upper contact 148 is larger than the size of the top end 146a of the lower contact 146. Similarly, the self-aligned contact 176 includes a lower contact 172 and an upper contact 174, the profile of the upper contact 174 and the lower contact 172 is zigzag, and the size of the top end 174a of the upper contact 174 is larger than the size of the top end 172a of the lower contact 172. Moreover, a top end 172a of the lower contact 172 of the self-aligned contact 176 is higher than a top end 146a of the lower contact 146 of the self-aligned contact 149.

In the above embodiments, two masks 140 and 150 having different patterns are used to perform the pattern transferring process of different stages of the contact opening. However, in practice, the present invention is not limited to this, and a single mask 140 or 150 can be used to achieve the objective, and the details will described below.

The Second Embodiment

FIGS. 2A-2E are sectional views of processes for the method of fabricating another semiconductor device according to an embodiment of the present invention.

The process of this embodiment is similar to that of the first embodiment, except that a single mask 140 is used to perform the etching processes of different stages of the contact opening in this embodiment.

Figure 2A:
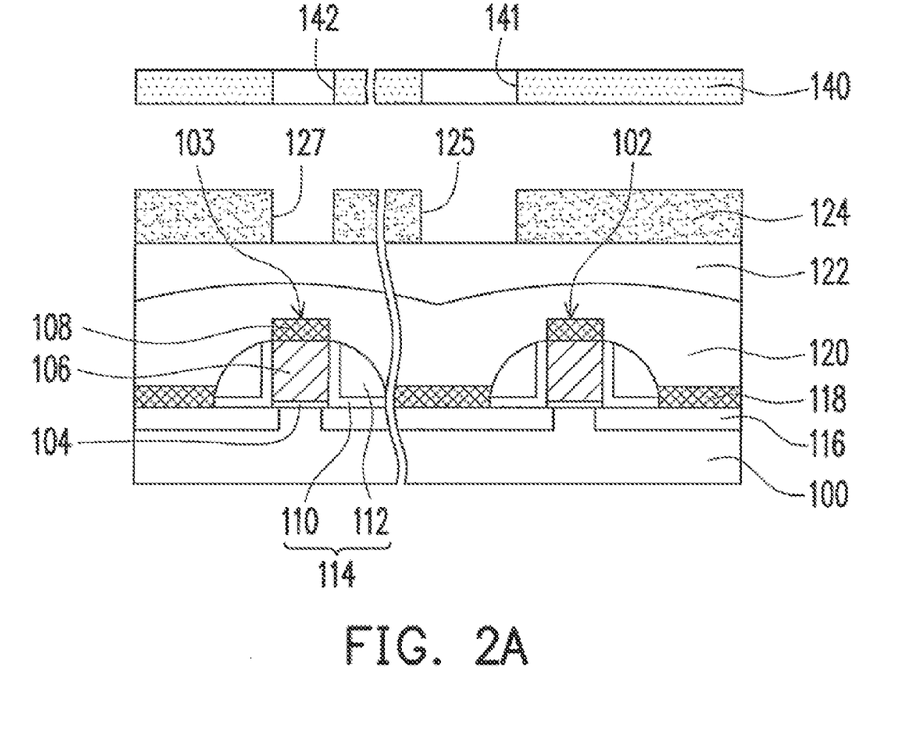
FIGS. 2A-2F are sectional views of processes of the method of fabricating another semiconductor device according to an embodiment of the present invention.
Figure 2B:
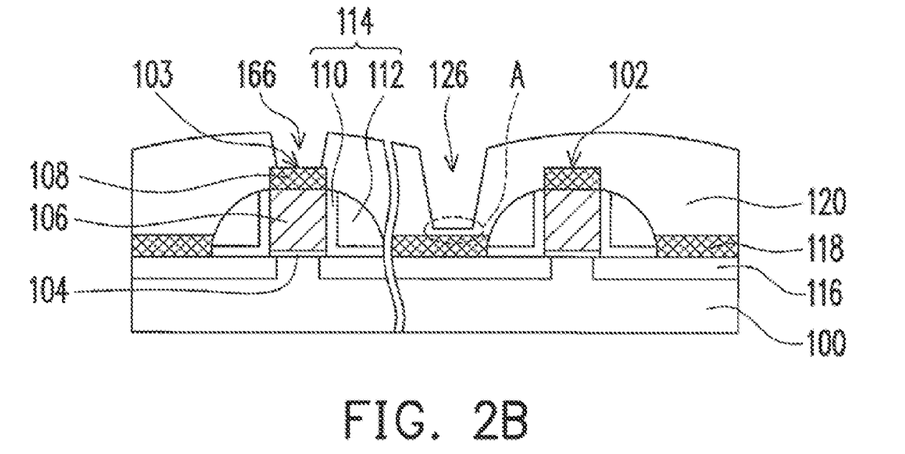

Referring to FIGS. 2A and 2B, the dielectric layer 120 and the BARC 122 are formed on the substrate 100 where transistors 102 and 103 are already formed according to the method of the first embodiment, the patterns 141 and 142 of the mask 140 are transferred to the photoresist layer 124, and the lower openings 126 and 166 are formed in the dielectric layer 120 with the etching process.

Figure 2C:
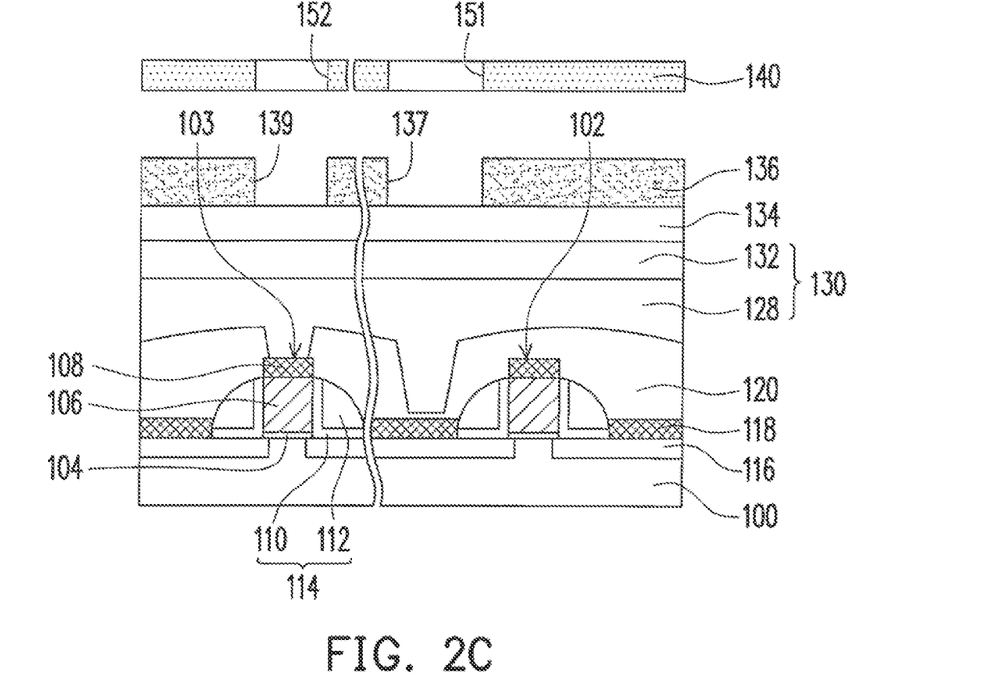
Figure 2D:
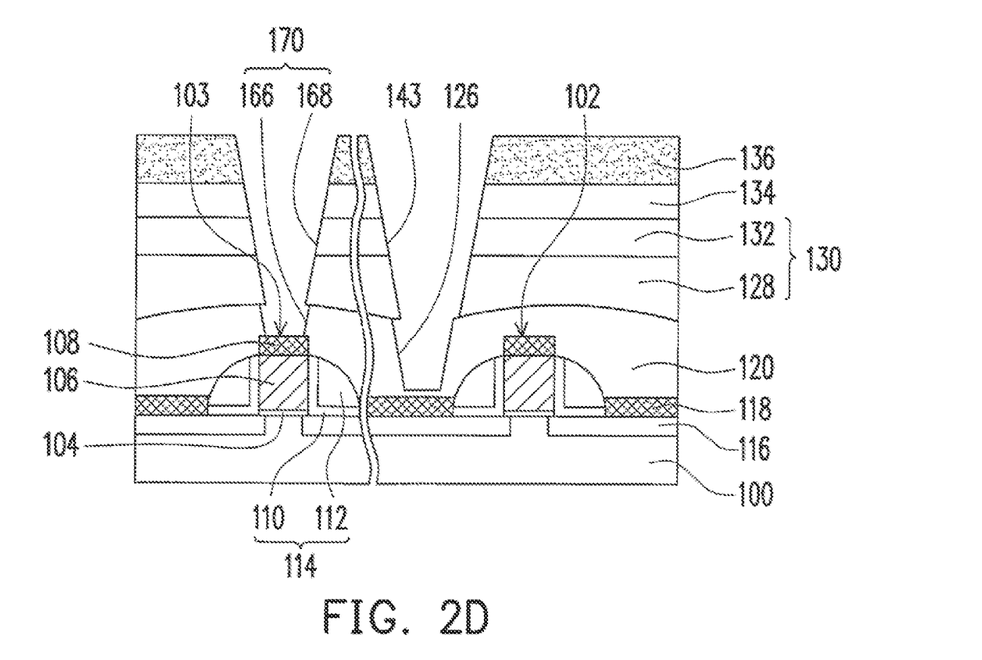

Referring to FIGS. 2C and 2D, the dielectric layer 130 and the BARC 134 are formed on the substrate 100 according to the method of the first embodiment. Then, with the mask 140 as a mask, the patterns 141 and 142 are transferred to the photoresist layer 130, and the upper openings 143 and 168 are formed in the dielectric layer 130 with the etching process. When transferring the patterns 141 and 142 of the mask 140 to the photoresist layer 124 or 136, the size of the openings formed in the photoresist layers 124 and 136 are different by adjusting an exposure parameter such as exposure energy.

Figure 2E:
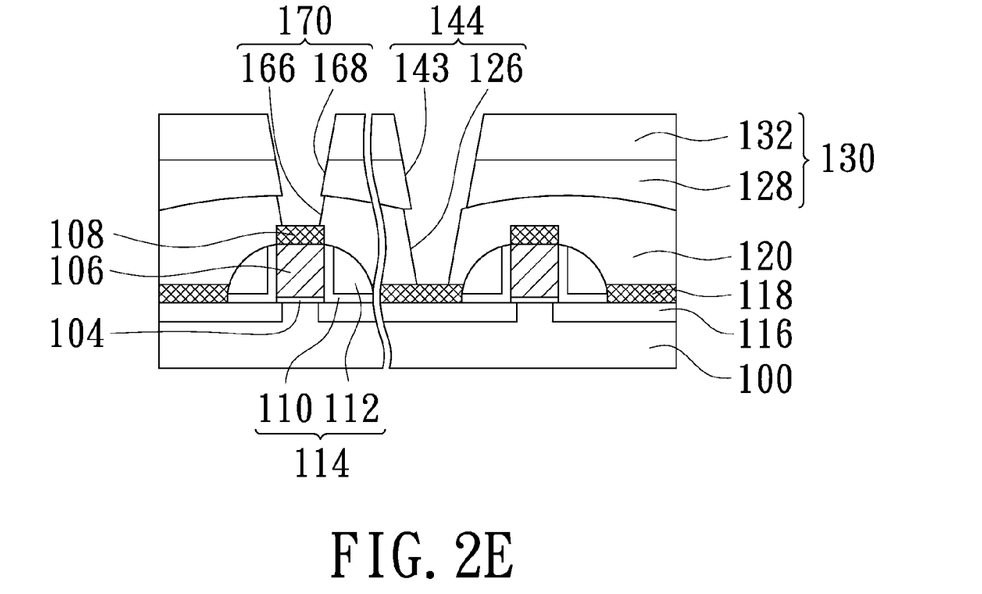
Figure 2F:
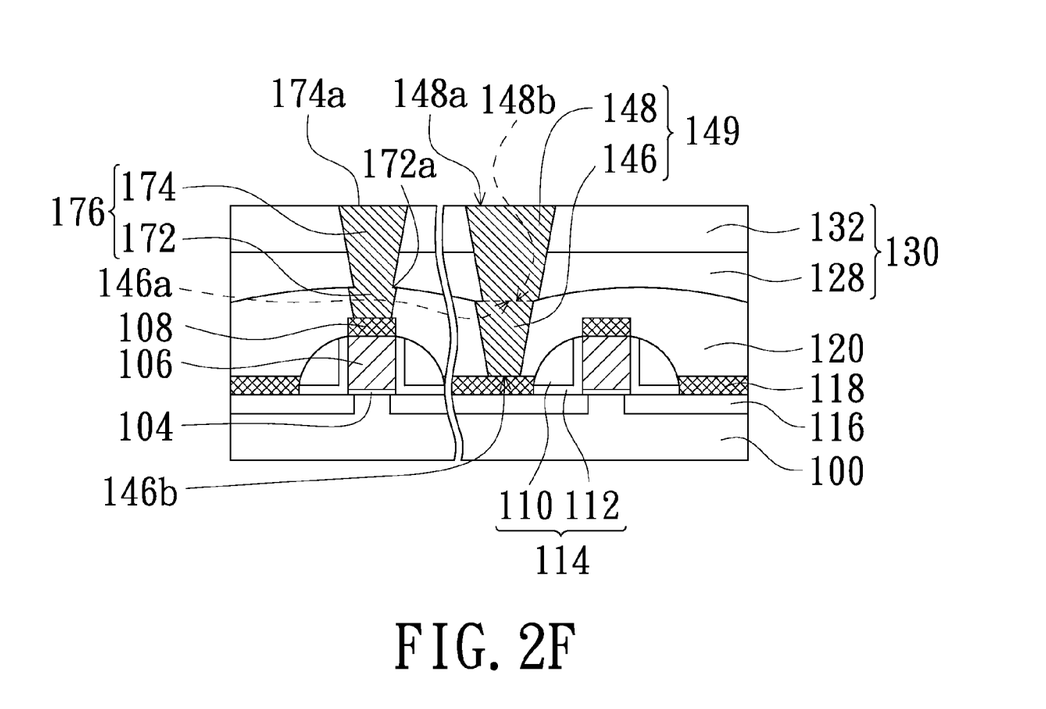

Referring to FIGS. 2E and 2F, the dielectric layer 120 at the bottom of the lower opening 126 is removed according to the method of the first embodiment, so as to form the self-aligned contact opening 144. Then, the self-aligned contact openings 144 and 170 are filled with the conductive layer, so as to form the self-aligned contacts 149 and 176.

In the above embodiments, the self-aligned contact is formed with two stages of lithography and etching processes. However, the process can be adjusted into a multi-stage process to perform etching with the increase of the aspect ratio of the contact, so as to reduce the difficulty in etching.

In view of above the self-aligned contact process of the present invention performs etching in two or more stages, such that the short circuit between the gate and the source/drain region resulting from the misalignment and long time over-etching can be avoided.

Moreover, due to the staged etching is adopted in the present invention, the aspect ratio of the contact opening in each stage is reduced, so the difficulty in etching is reduced, and the problem of incomplete open of the contact opening is avoided, thereby increasing the throughput of the process.

In the other aspect, the widely used stress layer can be used in the present invention. The stress layer can be used as a first dielectric layer of the lower opening of the self-aligned contact, and can also be used as the etch stop layer for the subsequent upper opening etching process. Therefore, in the process of the present invention, it is not required to additionally form a material layer having a material different from that of the second dielectric layer to serve as the first dielectric layer, or additionally form an etch stop layer.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A self-aligned contact set, comprising:
   a self-aligned gate contact; and
   a self-aligned source/drain contact;
   wherein each of the self-aligned gate contact and the self-aligned source/drain contact comprises:
      a lower contact, disposed in a dielectric layer on a substrate; and
      an upper contact, disposed in the dielectric layer and on the lower contact, and directly connected to the lower contact, wherein the lower contact and the upper contact are monolithically formed, and the profile of the upper contact and the lower contact is zigzag, and a top end of the lower contact of the self-aligned gate contact is higher than a top end of the lower contact of the self-aligned source/drain contact.

2. The self-aligned contact set as claimed in claim 1, wherein the lower contact has a wide top end and a narrow bottom end.

3. The self-aligned contact set as claimed in claim 1, wherein the upper contact has a wide top end and a narrow bottom end.

4. The self-aligned contact set as claimed in claim 1, wherein a size of a top end of the upper contact of the self-aligned gate contact is larger than a size of the top end of the lower contact of the self-aligned gate contact, and a size of a top end of the upper contact of the self-aligned source/drain contact is larger than a size of the top end of the lower contact of the self-aligned source/drain contact.

5. The self-aligned contact set as claimed in claim 1, wherein the dielectric layer comprises a first dielectric layer and a second dielectric layer, the lower contact is disposed in the first dielectric layer, and the upper contact is disposed in the second dielectric layer.

6. The self-aligned contact set as claimed in claim 5, wherein the first dielectric layer is a stress layer.

7. The self-aligned contact set as claimed in claim 5, wherein the material of the first dielectric layer is selected from a group consisting of silicon oxide deposited by atmospheric pressure CVD, silicon oxide deposited by high density plasma vapor deposition, phosphosilicate glass, borophosphosilicate glass, fluorine-doped silicon glass, and a combination thereof.

8. The self-aligned contact set as claimed in claim 5, wherein the first dielectric layer is conformally disposed on the substrate.

9. The self-aligned contact set as claimed in claim 5, wherein the top end of the lower contact of each of the self-aligned gate contact and the self-aligned source/drain contact is substantially level with a top surface of the first dielectric layer.

* * * * *